(12) United States Patent
Gu

(10) Patent No.: US 6,298,362 B1
(45) Date of Patent: Oct. 2, 2001

(54) APPARATUS AND METHOD FOR EQUALIZER FILTER UNITS RESPONSIVE TO 5-LEVEL INPUTS SIGNALS

(75) Inventor: Richard X. Gu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/176,726

(22) Filed: Oct. 21, 1998

Related U.S. Application Data

(60) Provisional application No. 60/062,722, filed on Oct. 22, 1997.

(51) Int. Cl.$^7$ .................................................. G06F 17/10
(52) U.S. Cl. ........................................... 708/323; 708/322
(58) Field of Search ................................... 708/322–323; 375/232–236

(56) References Cited

U.S. PATENT DOCUMENTS

| | | | |
|---|---|---|---|
| 5,734,598 | * | 3/1998 | Abbott et al. ........................ 708/322 |
| 5,970,094 | * | 10/1999 | Lee ....................................... 708/323 |
| 6,118,814 | * | 9/2000 | Friedman ............................. 375/232 |
| 6,216,148 | * | 4/2001 | Moran et al. ......................... 708/322 |

* cited by examiner

Primary Examiner—Tan V. Mai
(74) Attorney, Agent, or Firm—J. Dennis Moore; W. James Brady, III; Frederick J. Telecky, Jr.

(57) ABSTRACT

In a transceiver unit in which the information is encoded in a plurality of levels, a update unit for an adaptive or equalizer filter unit includes apparatus (51–56) for forming product of error signals and data signals without using a multiplier unit. The plurality of levels is represented by a logic signal format ($b_2$, $b_1$, $b_0$) for five signal levels. The components of the logic signal format ($b_2$, $b_1$, $b_0$) provide the control signals which process the error signals in such a manner as to provide the appropriate product. The only arithmetic unit is an adder unit (56) needed to combine the previous coefficient $W_{n,t-1}$ with the product generated by the apparatus (51–56).

14 Claims, 3 Drawing Sheets

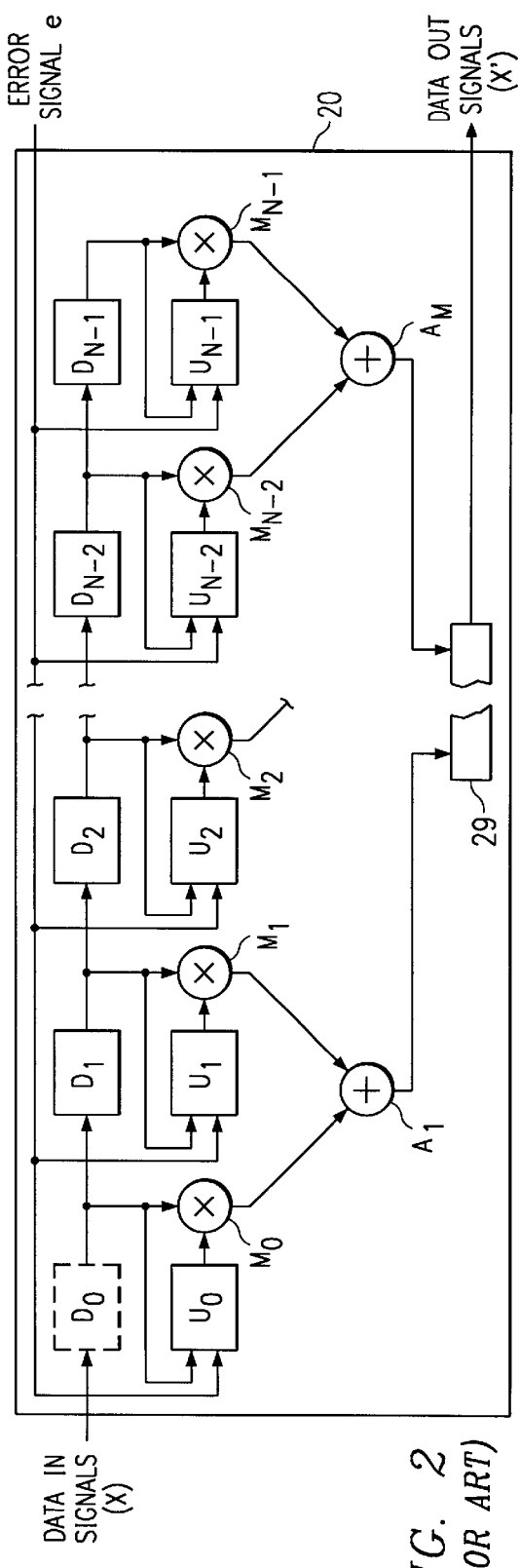
*FIG. 2*
*(PRIOR ART)*
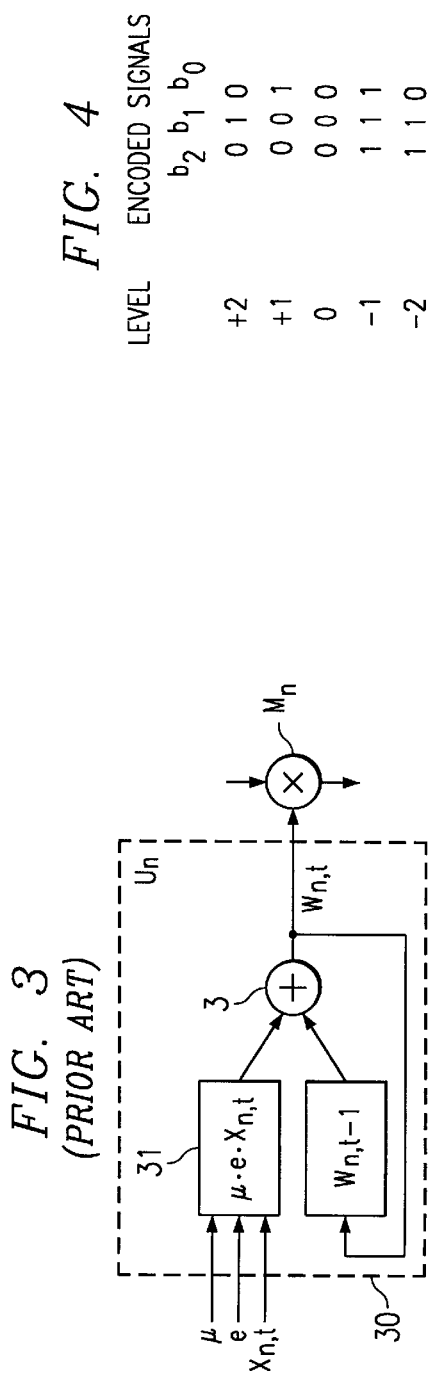
*FIG. 4*
| LEVEL | ENCODED SIGNALS |
|---|---|
| | $b_2\ b_1\ b_0$ |
| +2 | 0 1 0 |
| +1 | 0 0 1 |
| 0 | 0 0 0 |
| −1 | 1 1 1 |
| −2 | 1 1 0 |
*FIG. 3*
*(PRIOR ART)*

US 6,298,362 B1

APPARATUS AND METHOD FOR EQUALIZER FILTER UNITS RESPONSIVE TO 5-LEVEL INPUTS SIGNALS

This amendment claims priority under 35 USC §119(e)(1) of provisional application no. 60/062,722, filed Oct. 22, 1997.

BACKGROUND OF THE INVENTION

1. Field of the Invention

This invention relates generally to the processing of signals in communication systems and, more particularly, to the processing of signals by adaptive or equalizer filter circuits. Equalizer filter circuits or adaptive filter circuits are used to compensate for distortion introduced into the channel during the transmission of signals. The present invention has particular applicability to modem units.

2. Description of the Prior Art

Referring to FIG. 1, a block diagram of a transceiver unit capable of advantageously using the present invention is shown. INPUT SIGNALS are applied to symbol decoder and side-stream descrambler unit 11. Output signals from the symbol encoder and side-stream scrambler unit 11 are applied to transmitter unit A 15 and to transmitter unit B 13. The output signals from transmitter unit A 15 are applied to hybrid unit 18, while the output signals from transmitter unit B 13 are applied to hybrid unit 17. The output signals from hybrid unit 17 and hybrid unit 18 are applied to cable 19. Signals from cable 19 are transmitted through hybrid unit 17 to receiver unit B 14 and through hybrid unit 18 to receiver unit A 16. The output signals from receiver unit A 16 and from receiver unit B 14 are applied symbol decoder and side-stream descrambler unit 12. The output signals from the symbol decoder and side-stream descrambler unit 12 are the OUTPUT SIGNALS from the transceiver.

In the transmitter unit A 15, the input signals are applied to a digital transmit filter unit 151. The output signals from the digital transmit filter unit 151 are processed by an digital-to-analog converter unit 152 and applied to an analog transmit filter unit 153. The output signal of the analog transmit unit 153 is the output signal of the transmitter A 15 which is applied to a hybrid unit 18. The transmitter B 13 is implemented in a similar manner.

With respect to the receiver A 16, the output signals from the hybrid unit 18 are applied to a VGA unit 169. The output signals from the VGA unit 169 are processed by an analog receive filter unit 168 and applied to an analog-to-digital converter unit 167. Output signals from the analog-to-digital converter unit 167 are applied to a digital linear forward equalizer unit 166 and to a gain, timing, control unit 170. The signals from the digital linear forward equalizer unit 166 are applied to a summation network 165 and to the gain, timing and control unit 170. The gain, timing and control unit 170 applies control signals to the VGA unit 169 and to the analog-to-digital converter unit 167. The summation unit 165 also receives signals from an echo canceller unit 161, from a NEXT canceller unit 162 and from a feedback filter/noise predictor unit 164. Output signals from the summation unit 165 are applied to a decision unit 163. The decision unit 163 provides the output signal for receiver A 16. The output signal from the decision unit 163 is also applied to the feedback filter/noise prediction unit 164. The decision unit 163 applies an error signal to the echo canceller unit 161, to NEXT canceller unit 162, to feedback filter/noise reduction unit 164, and to digital linear forward equalizer unit 166. The echo canceller unit also receives signals which are applied to the transmitter A 15 associated with the receiver A 16, while the NEXT canceller unit 162 receives an input signal from the transmitter B 13 not associated with the receiver unit A 16 which includes the NEXT canceller unit 162. The receiver B 13 is implemented in a manner similar to receiver A 16.

Referring to FIG. 2, a block diagram of an adaptive equalizer filter unit 20, such as would be used to implement the echo canceller unit 161 and the NEXT canceller unit 162 of FIG. 1, is shown. The equalizer unit 20 includes a multiplicity N of stages. Each stage n of the equalizer unit 13 includes a delay line $D_n$, (the delay line $D_0$ is shown with dotted lines because the presence of this delay line is not needed to the operation of filter 20. The delay lines $D_0$–$D_{N-1}$ of all of the stages are coupled in series. The output terminal of each delay line $D_n$ is coupled, in addition to being coupled to the next sequential delay line $D_{n+1}$, to a multiplier unit $M_n$ associated with the $n^{th}$ stage and to an input terminal of update unit $U_n$ associated with the $n^{th}$ stage. Each multiplier unit $M_n$ also receives a coefficient signal $C_n$. The coefficient signal $C_n$ is a signal group stored in the update unit $U_n$ which is updated $U_n$ in response to an ERROR signal e and the output signal of delay line $D_n$. An ERROR signal e is generated as a result of each signal group processed in the decision unit shown in FIG. 1. The product of the signals $C_n$ and the output signal from delay line $D_n$ formed in multiplier unit $M_n$ is applied to one terminal of adder unit $A_m$. The adder unit $A_m$ also receives an output signal from one of the neighboring filter stages. The adder units $A_0$–$A_{M-1}$ are the first stage of an adder tree, the remaining adder units would be included in element 29. The output signals of the adder tree, including the adder units $A_0$–$A_{M-1}$ and the element 29, are the DATA OUT signals (X').

The signals applied to the multiplier unit $M_n$ are the following:

$X_n$ is the output signal from delay line $D_n$, and $W_n$ is given by the formula $W_{n,t}=W_{n,t-1}+\mu\star e_t\star X_{n,t}$, where $\mu$ is a constant.

The output signal of the multiplier unit is given by $I_{n,t}=W_{n,t}\star X_{n,t}$.

As a result of these equations, three multiplication operations are required are required for each stage of the equalizer filter. However, the selection of the constant $\mu$ has a flexibility which permits the execution of the multiplication operation by means of a shift operation, an operation which is not apparatus intensive. The two remaining multiplication operations, when implemented with typical multiplier apparatus, can require extensive space on the integrated circuit board.

Referring to FIG. 3, a schematic block diagram of an update unit 30 ($U_n$) is shown. The update unit 30 has a multiplier unit 31 which receives the filter constant $\mu$, the error signal $e_t$, and the data signal $X_{n,t}$. The product formed by these three quantities are applied to an input terminal of adder unit 33. Also applied to an input terminal of adder unit 33 is the previously formed coefficient $W_{n,t-1}$ stored in register 32. The output signal of adder unit 33 is the coefficient $W_{n,t}$. The coefficient $W_{n,t}$ is applied to multiplier unit $M_n$ associated with same stage of the adaptive filter unit as the update unit $U_n$ and the coefficient $W_{n,t}$ is applied to register 32 to be used in generating the next coefficient $W_{n,t+1}$.

As will be clear, the multiplication of the error signal e and the data signal $X_n$ will require complex apparatus. In addition, each stage of the adaptive equalizer filter unit requires a multiplier unit. Therefore, a substantial portion of the components implementing the adaptive equalizer filters and, consequently, the transceiver itself will be dedicated to implementation of the multiplier units. In the present transceiver, the information is formatted into five signal levels. These signal levels are converted into analog signals and transmitted over a transmission medium (cable). The transceiver receives similarly encoded signals and the original five levels recovered.

A need has therefore been felt for apparatus and for an associated method to reduce the number of components required to perform the multiplication operation of the update unit in an adaptive equalizer unit in the transceiver described above.

SUMMARY OF THE INVENTION

The aforementioned and other features are accomplished, according to the present invention, by providing a multiplier unit which takes advantage of the fact that the data signal have a limited number of levels. By making use of the limited number of possible data signals, these data signals are used to process, rather than multiply, the error signal. The elements used in processing to provide a product of the error signal and the (limited number of) signal levels include logic units, gate units, a delay line, and an adder unit. The adder unit and the delay line are needed to combine the previous coefficient $W_{n,t-1}$ with the newly determined error signal/data signal product.

These and other features of the present invention will be understood upon the reading of the following description in conjunction with the Figures.

BRIEF DESCRIPTION OF THE DRAWINGS

FIG. 2 is a block diagram of an adaptive equalizer filter unit according to the prior art.

FIG. 3 illustrates a multiplier unit used in the update unit of an adaptive equalizer filter unit according to the prior art.

FIG. 4 illustrates the logic bit signal representation of the five signal levels into which the information has been encoded.

FIG. 5A is a schematic block diagram of the apparatus for forming the product of the error signals and the data signals for an update unit according to the present invention, while

DESCRIPTION OF THE PREFERRED EMBODIMENT(S)

1. Detailed Description of the Drawings

Figure 1:
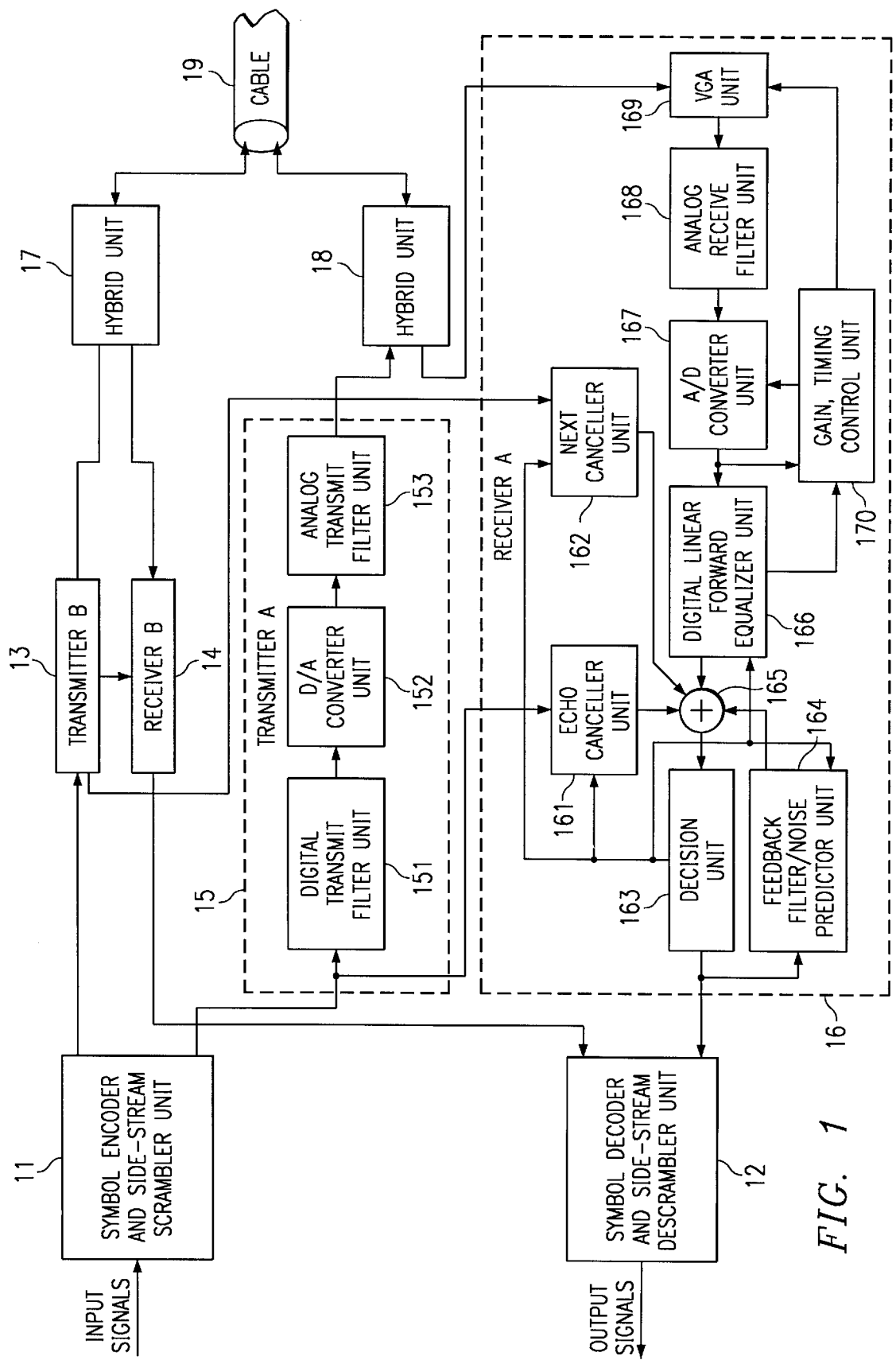
FIG. 1 is a block diagram of a transceiver unit in which the reduced error bit technique in a fast adaptive equalizer circuit of the present invention can be advantageously implemented.

FIG. 1, FIG. 2, and FIG. 3 have been discussed with respect to the prior art.

Referring to FIG. 4, an formatting scheme for representing the five data signal levels in a logic signal is shown. In this implementation, the five transceiver input signal levels that are designated (+2, +1, 0, −1, −2). The formatting scheme shown in FIG. 4 is a two's complement encoding scheme. Level +2 is represented by (0,1,0), level +1 is represented by (0,0,1), level O is represented by (0,0,0), level −1 is represented by (1,1,1), and level −2 is represented by (1,1,0).

Figure 5A:
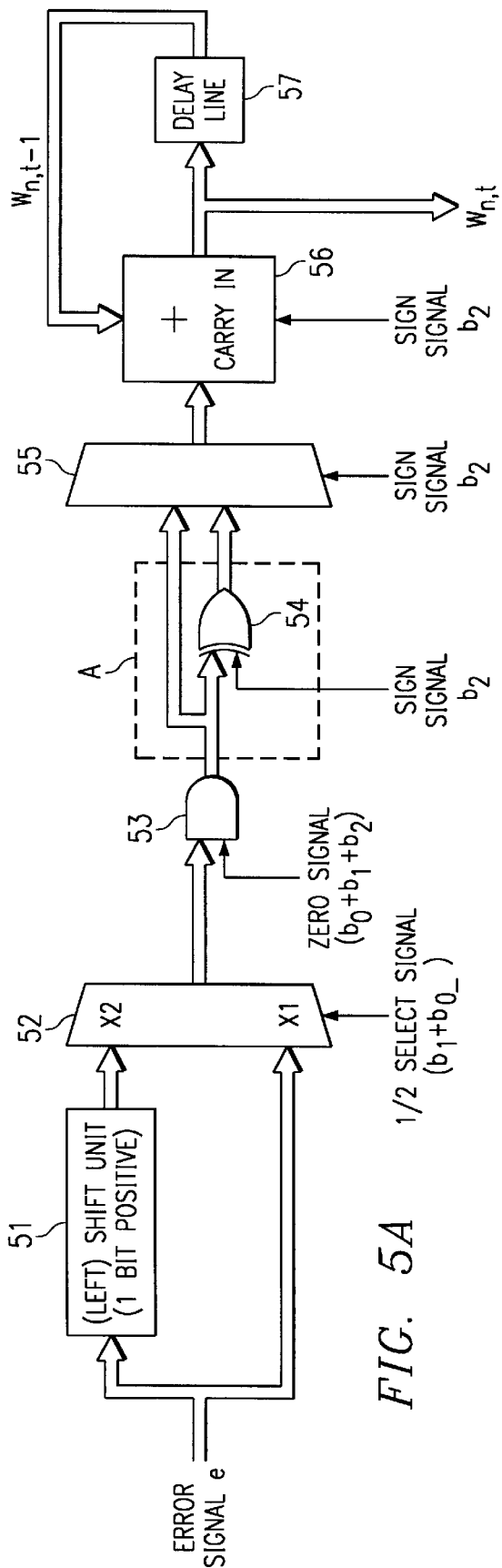
Figure 5B:
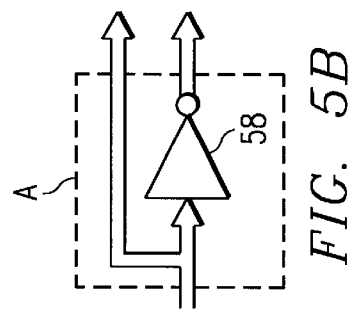
FIG. 5B shows a component which can replace an apparatus component in the embodiment shown in FIG. 5A.

Referring to FIG. 5A, a unit for forming the product of an ERROR signal and a data signal to provide the coefficient $W_{n,t}$, according to the present invention is shown. The ERROR signal e is applied to one set of input terminals of multiplexer unit 52 and the ERROR signal e is applied, through (one bit position left) shift unit 51, to the second input terminals of multiplexer unit 52. The control signal ($b_1 b_0$), obtained from the logic signal set representing data signal levels, selects between the ERROR signal (X1) and the shifted ERROR signal (X2). The output signals of the gate unit 52 are applied to a first set of input terminals of logic AND gate 53. A second terminal of logic AND gate 53 has the logic signals ($b_2+b_1+b_0$) applied thereto. The output signals of logic AND gate 53 are applied to a first set of input terminals of gate unit 55 and to a first set of input terminals of logic EXCLUSIVE OR gate 54. A second terminal of logic EXCLUSIVE OR gate 54 has the logic signal ($b_2$). The output signals from logic EXCLUSIVE OR gate 54 are applied to a second set of input terminals of multiplexer unit 55. The selection of the output signal of the multiplexer unit 55 is determined by logic signal ($b_2$). The output signals from multiplexer unit 55 are applied to a first set of terminals of adder unit 56. The output terminals of adder unit 56 provide the coefficient signals $W_{n,t}$. The $W_{n,t}$ signals are applied to delay line 57 which supplied the previous coefficient signals $W_{n,t-1}$ to a second set of input terminals of adder unit 56. Adder unit 56 also receives the logic signal ($b_2$) in the carry-in position. The logic EXCLUSIVE OR gate 54 can be replaced with an inverter unit 58, as shown in FIG. 5B.

2. Operation of the Preferred Embodiment(s)

The present invention can be understood in the following manner. The shift unit 51 multiplies the error signals by a factor of two as required by either the +2 level or the −2 level. The +1 and the −1 levels require that the error signals be multiplied by 1 and therefore, the error signals are applied directly to the second set of terminals of multiplexer unit 52. The control signals ($b_1 b_0$__) select the +/−1 level of the +/−2 level. The logic AND gate 53 passes the signals applied to first set of input terminals unless the 0 level is present, i.e., $b_2+b_1+b_0=0$. Because $b_2+b_1+b_0=0$ represents the 0 level, then, when this condition is true, then zero signals are transmitted by logic AND gate 53. The logic EXCLUSIVE OR gate 54 and the inverter unit 58 provide complementary sets of signals to the two sets of terminals of multiplexer unit 55. The correct set of complementary signals are necessary for the addition performed in adder unit 56. Because the result $W_{n,t}$ will depend on the signal of both $W_{n,t-1}$ and the sign of signals transmitted by multiplexer unit 55, the logic signal (b2) must be applied to the adder unit 56. The delay line 57 provides the delay whereby the coefficient signals $W_{n,t}$ are added to the product which has been performed. In this manner, the coefficient signals $W_{n,t}$ can be performed without requiring a multiplier unit.

This apparatus and technique depend upon symmetric signal levels. The present apparatus can be used for the three level data signal representation by eliminating the shift unit 51 and the multiplexer unit 52. The method can be extended to more that five levels when the levels have magnitudes which differ by a factor of two.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. Apparatus for forming coefficient signals in an update unit of an adaptive equalizer filter, said apparatus responsive to error signals and a data signals having a plurality of signal levels, wherein non-zero, equal sign data signal levels differ from a neighboring data signal level by a factor of 2, said apparatus comprising:
   at least one shift unit for providing intermediate error signals, said intermediate errors signals having the same magnitudes as said data signal levels;
   a first selection unit for selecting intermediate error signals determined by logic signals representing a current data signal;
   a complementary unit for providing complementary intermediate error signals which are the complement of said intermediate error signals;
   a second selection unit responsive to said logic signals for selecting a second intermediate error signal from a one of said intermediate error signals and said complementary error signals;
   a delay line; and
   an adder unit, said adder unit adding second intermediate and delay line signals stored in said delay in response to a control signal representing at least a portion said logic signals representing a current data signal, an output signal of said adder unit replacing said delay line signals, said output signal of said adder unit providing said coefficient signal.

2. The apparatus of claim 1 wherein said plurality of signal levels consists of five levels.

3. The apparatus of claim 2 wherein said plurality of signal levels can be represented by the values (2, 1, 0, −1, −2).

4. In the update unit of an adaptive filter unit, a method of forming a product of the error signal and a data signal, wherein each data signal is represented by one of a plurality of levels, said method comprising the steps of:
   shifting said error signal by an amount determined by a magnitude of a data signal level to form an intermediate signal when a magnitude of said error signal is not zero; and
   transmitting and selecting a sign for said intermediate signal.

5. The method of claim 4 further comprising the step of transmitting a zero intermediate signal when a said error signal is a zero signal.

6. The method of claim 5 further comprising the steps of:
   forming the complement forming a complement signal of said intermediate signal; and
   using a sign of said data signal, selecting a one of said intermediate signal and said complementary intermediate signal to provide a selected intermediate signal.

7. The method of claim 6 further including the step of forming a coefficient signal by adding to a previously formed coefficient signal said selected intermediate signal in accordance with a sign of said selected intermediate signal.

8. The method of claim 7 further including the step of storing said coefficient signal, said stored coefficient signal then being the previously formed coefficient signal.

9. Apparatus for forming a coefficient signal in an update unit of an adaptive equalizer circuit, said coefficient signal being a product of an error signal and a data signal, said data signal having a plurality of levels, said apparatus comprising:
   a shifter unit responsive to an error signal for providing an intermediate signal, said intermediate signal being a product of said error signal and a magnitude of a data signal level;
   an inverter unit for forming a complement signal;
   a selection unit responsive to sign of said data signal for selecting between said complement signal and said intermediate signal to provide a selected intermediate signal;
   a storage unit; and
   an adder unit responsive to said selected intermediate signal and a signal stored in said storage unit for providing a coefficient signal, said coefficient signal being applied to said storage unit.

10. The apparatus of claim 9 wherein said plurality of levels consists of five signal levels.

11. The apparatus of claim 10 wherein said plurality of signal levels can be represented by the values (2, 1, 0, −1, −2).

12. Apparatus for forming a coefficient signal in an update unit of an adaptive equalizer circuit, said coefficient signal being a product of an error signal and a data signal, said data signal having a plurality of levels, said apparatus comprising:
   a shifter unit responsive to an error signal for providing at least one intermediate signal, said one intermediate signal being a product of said error signal and magnitude of a data signal level; and
   selection apparatus responsive to said a level signal for selecting a one of said error signal, said one intermediate signal and a zero signal along with a sign to provide a selected signal;
   an adder unit for adding said selected signal to a next previous coefficient signal to provide said coefficient signal; and
   a storage unit for storing said coefficient unit, said stored coefficient unit thereafter providing said next previous coefficient unit.

13. The apparatus of claim 12 wherein said plurality of levels consists of five levels.

14. The apparatus of claim 13 wherein said five levels are designated (2, 1, 0, −1, −2).

* * * * *